(12) United States Patent
Schmidt et al.

(10) Patent No.: US 7,981,321 B2
(45) Date of Patent: Jul. 19, 2011

(54) ILLUMINATION SYSTEM COMPRISING A YELLOW GREEN-EMITTING LUMINESCENT MATERIAL

(75) Inventors: Peter Schmidt, Aachen (DE); Volker Bachmann, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 703 days.

(21) Appl. No.: 11/993,476

(22) PCT Filed: Jun. 28, 2006

(86) PCT No.: PCT/IB2006/052154
§ 371 (c)(1),
(2), (4) Date: Dec. 21, 2007

(87) PCT Pub. No.: WO2007/004138
PCT Pub. Date: Jan. 11, 2007

(65) Prior Publication Data
US 2010/0079058 A1 Apr. 1, 2010

(30) Foreign Application Priority Data
Jun. 30, 2005 (EP) .................................... 05105970

(51) Int. Cl.
*C09K 11/64* (2006.01)
*C09K 11/80* (2006.01)
(52) U.S. Cl. ................. 252/301.4 F; 313/503; 313/486; 257/98
(58) Field of Classification Search ............ 252/301.4 F; 313/503, 486; 257/98
See application file for complete search history.

(56) References Cited

U.S. PATENT DOCUMENTS
5,292,489 A 3/1994 Fanelli et al.
(Continued)

FOREIGN PATENT DOCUMENTS
EP 1413618 4/2004
(Continued)

OTHER PUBLICATIONS
Chem. Abstract citation 131:108438-1999, abstract for Uheda et al article "Synthesis and photoluminescence of the ceramic phosphors using LaSi3N5 as a host lattice".*
Uheda et al article "Synthesis and photoluminescence of the ceramic phosphors using LaSi3N5 as a host lattice",Kotai no Hannosei Toronkai Koen Yokoshu, 10, 1999, abstract.*

(Continued)

*Primary Examiner* — C. Melissa Koslow
(74) *Attorney, Agent, or Firm* — Dicran Halajian; Mark L. Beloborodov

(57) ABSTRACT

An illumination system, comprising a radiation source and a luminescent material comprising a phosphor capable of absorbing a part of light emitted by the radiation source and emitting light of a wavelength different from that of the absorbed light; wherein said phosphor is a europium-activated oxonitridoalumosilicate of general formula $AE_{1-y-z}Ln_ySi_3-xAl_{x-a}B_aO_{1+x-y}N_{4-x+y}:Eu_z$, wherein AE is an alkaline earth metal selected from the group of Sr, Ca, Ba, Mg and Zn; Ln is a lanthanide metal selected from the group of La, Ce, Pr, Nd, Sm, Gd, Tb, Dy, Ho, Er, Tm, Yb, Lu, and Y; B is a trivalent metal selected from the group of boron, gallium and scandium and a $0 \leq a < 2$, $0 \leq x < 2$, $0 \leq y \leq 1$, $0.001 < z \leq 0.1$ provides white or colored illumination with high efficacy. The invention also relates to a luminescent material comprising a phosphor capable of absorbing a part of light emitted by the radiation source and emitting light of a wavelength different from that of the absorbed light; wherein said phosphor is a europium-activated oxonitridoalumosilicate of general formula $AE_{1-y-z}Ln_ySi_{3-x}Al_{x-a}B_aO_{1+x-y}N_{4-x+y}$: Euz, wherein AE is an alkaline earth metal selected from the group of Sr, Ca, Ba, Mg and Zn; Ln is a lanthanide metal selected from the group of La, Ce, Pr, Nd, Sm, Gd, Tb, Dy, Ho, Er, Tm, Yb, Lu, and Y; B is a trivalent metal selected from the group of boron, gallium and scandium and $0 \leq a < 2$, $0 \leq x < 2$, $0 \leq y \leq 1$. $0.001 < z \leq 0.1$.

9 Claims, 2 Drawing Sheets

U.S. PATENT DOCUMENTS

| | | | | |
|---|---|---|---|---|
| 6,670,748 B2 | * | 12/2003 | Ellens et al. | 313/503 |
| 7,321,191 B2 | * | 1/2008 | Setlur et al. | 313/487 |
| 2005/0001225 A1 | * | 1/2005 | Yoshimura et al. | 257/98 |

FOREIGN PATENT DOCUMENTS

| | | |
|---|---|---|
| WO | 2004055910 | 7/2004 |

OTHER PUBLICATIONS

K. Uheda et al; "Synthesis and Luminescent Property of EU3+-Doped LASI3N5 Phosphor", Journal of Luminescence, vol. 87-90, 2000, pp. 967-969, XP002405610.

* cited by examiner

ILLUMINATION SYSTEM COMPRISING A YELLOW GREEN-EMITTING LUMINESCENT MATERIAL

The present invention generally relates to an illumination system comprising a radiation source and a luminescent material comprising a phosphor. The invention also relates to a luminescent material for use in such an illumination system.

More particularly, the invention relates to an illumination system for the generation of specific, colored light, including white light, by luminescence down conversion and additive color mixing based on a UV-A to blue-emitting diode in combination with a luminescent material comprising a green-emitting phosphor. A light-emitting diode as a radiation source is especially contemplated.

Today light emitting illumination systems comprising visible colored light emitting diodes as radiation sources are used single or in clusters for all kind of applications where rugged, compact, lightweight, high efficiency, long-life, low voltage sources of white or coloured illumination are needed.

Such applications comprise inter alia illumination of small LCD displays in consumer products such as cellular phones, digital cameras and hand-held computers. Pertinent uses include also status indicators on such products as computer monitors, stereo receivers, CD players, VCRs, and the like. Such indicators are also found in systems such as instrument panels in aircraft, trains, ships, cars, etc.

Multi-color combinations of pluralities of monochromatic LEDs in addressable arrays containing hundreds or thousands of LED components are found in large-area displays such as full color video walls and also as high brightness large-area outdoor television screens. Green, amber and red-emitting LEDs are increasingly being used as traffic lights or in effect-lighting of buildings.

Conventional monochromatic light emitting diodes, however, are typically subject to low yield and are considered difficult to fabricate with uniform emission characteristics from batch to batch. Monochromatic LEDs can also exhibit large wavelength variations across the wafer within a single batch, as well as strong wavelength and emission variations with operation conditions such as drive current and temperature.

Therefore, when generating white light with an arrangement comprising monochromatic LEDs, there has been a problem that white light of the desired tone cannot be generated due to variations in the tone, luminance and other factors of the light emitting diodes. Similarly, generating of broadband white light is difficult.

Because light emitting diodes typically do not emit over a broad range of wavelengths, a number of schemes for combinations of LEDs with phosphors have been proposed and subsequently demonstrated to enable broadband emission with an ultimate goal of achieving a high efficiency semiconductor-based white light source.

Such phosphor-enhanced "white" LED systems have been based in particular on the dichromatic (BY) approach, mixing yellow and blue colors, in which case the yellow secondary component of the output light may be provided by a yellow green phosphor and the blue component may be provided by a phosphor or by the primary emission of a blue LED.

For example, U.S. Pat. No. 6,670,748 discloses an illumination unit having at least one LED as a light source, the LED emitting primary radiation in the range from 300 to 570 nm, this radiation being partially or completely converted into longer-wave radiation by phosphors which are exposed to the primary radiation of the LED, in which unit the conversion takes place at least with the aid of a nitride-containing phosphor which emits with a peak emission wavelength at 430 to 670 nm and which originates from the class of the Ce- or Eu-activated nitrides, oxynitrides or sialons.

Yet, overall efficacy is a recognized problem with phosphor converted illumination systems comprising light emitting diodes, especially blue to violet emitting diodes, as currently known phosphors had not been developed and optimized for excitation by such radiation sources.

The present invention provides an illumination system, comprising a radiation source and a luminescent material comprising a phosphor capable of absorbing a part of light emitted by the radiation source and emitting light of wavelength different from that of the absorbed light; wherein said phosphor is a europium-activated oxonitridoalumosilicate of general formula $AE_{1-y-z}Ln_ySi_{3-x}Al_{x-a}M_aO_{1+x-y}N_{4-x+y}:Eu_z$, wherein AE is selected from the group of Sr, Ca, Ba, Mg and Zn; Ln is selected from the group of La, Ce, Pr, Nd, Sm, Gd, Tb, Dy, Ho, Er, Tm, Yb, Lu, and Y; M is a trivalent metal selected from the group of boron, gallium and scandium and $0 \leq a < 2$, $0 \leq x < 2$, $0 \leq y \leq 1$, $0.001 < z \leq 0.1$.

According to a first aspect of the invention a white light illumination system comprising a light emitting diode preferably having a peak emission wavelength in the violet to blue-wavelength range of 400 to 480 nm as a radiation source is provided.

An essential factor is that the excitation spectrum of yellow green phosphors of the europium(II)-activated alkaline earth oxonitridoalumosilicate type is so broad-banded in the range from 400 to 480 nm, that they are sufficiently excited by all blue to violet light emitting diodes in the market.

Such illumination system has desirable characteristics for general lighting purposes providing high brightness at moderate cost, because of its improved efficacy.

The efficacy of an illumination system using a source of primary radiation and a phosphor, which converts primary radiation in secondary radiation, is especially dependent on the efficiency of that luminescence conversion process.

The efficiency of a luminescence conversion process may be characterized by a number of parameters, including extinction coefficient, excitation and emission spectrum, quantum yield and losses due to Stokes' shift. Stokes' shift is the difference in wavelengths between the maximum of the emission spectrum of the primary radiation source and the maximum of the excitation spectrum of the phosphor.

In the illumination systems according to the invention the efficiency losses due to Stokes shift are especially small, as the phosphors according to the invention have an unusually broad continuous and unstructured excitation band in the blue, violet and near-ultraviolet range of the electromagnetic spectrum. The energy loss, which is associated with the decrease in frequency of the emitted secondary radiation with regard to the absorbed primary radiation, can be kept at minimum. Total conversion efficiency can be up to 90%.

The better compatibility of the broadband excitation band of the phosphor with the narrow emission maxima of the LEDs permits the light emitting diodes to excite at their emission maximum, rather than at longer wavelengths with lower extinction coefficients.

According to one embodiment of the invention the luminescent material comprises a second phosphor, preferably a red phosphor selected from the group of $(Ca_{1-x}Sr_x)S:Eu$, wherein $0 \leq x \leq 1$ and $(Sr_{1-x-y}Ba_xCa_y)_{2-z}Si_{5-a}Al_aN_{8-a}O_a:Eu_z$ wherein $0 \leq a < 5.0 < x \leq 1$, $0 \leq y \leq 1$ and $0 < z \leq 0.09$.

The emission spectrum of such a luminescent material comprising additional red phosphors has the appropriate wavelengths to obtain together with the blue to violet light of the LED and the green to yellow green broadband light of a europium-activated oxonitridoalumosilicate type phosphor according to the invention a composite white output light that is well-balanced with respect to color, in particular when the composite white output light has a narrow band emission in the red. This characteristic makes the device ideal for applications in which high lumen equivalence is required.

Simulations of white emitters show that high efficacy and color rendering can be achieved with an output light spectrum consisting of spectrally narrow emission in the blue and red regions, with a slightly broader emission in the green region.

Another aspect of the present invention provides luminescent material comprising a phosphor capable of absorbing a part of light emitted by the radiation source and emitting light of wavelength different from that of the absorbed light; wherein said phosphor is a europium-activated oxonitridoalumosilicate of general formula $AE_{1-y-z}Ln_ySi_{3-x}Al_{x-a}M_aO_{1+x-y}N_{4-x+y}:Eu_z$, wherein AE is selected from the group of Sr, Ca, Ba, Mg and Zn; Ln is selected from the group of La, Ce, Pr, Nd, Sm, Gd, Tb, Dy, Ho, Er, Tm, Yb, Lu, and Y; M is a trivalent metal selected from the group of boron, gallium and scandium and $0 \leq a < 2$, $0 \leq x < 2$, $0 \leq y \leq 1$, $0.001 < z \leq 0.1$.

The luminescent material is excitable by UV-radiation, which has such wavelengths as from 325 nm to 480 nm, but is excited with higher efficiency by blue to violet light emitted by a blue light emitting diode having a wavelength around 400 to 480 nm. Thus the luminescent material has ideal characteristics for conversion of the blue light of nitride semiconductor light emitting component into white light.

These phosphors are broadband emitters wherein the visible emission is so broad that there is no 80 nm wavelength range where the visible emission is predominantly located.

Additional important characteristics of the phosphors include 1) resistance to thermal quenching of luminescence at typical device operating temperatures (e.g. 80° C.); 2) lack of interfering reactivity with the encapsulating resins used in the device fabrication; 3) suitable absorptive profiles to minimize dead absorption within the visible spectrum; 4) a temporally stable luminous output over the operating lifetime of the device and; 5) compositionally controlled tuning of the phosphors excitation and emission properties.

The phosphor may comprise praseodymium(III) and samarium(III) as co-activators, which are able to enhance the red emission.

It is also preferred that the phosphor comprises the co-activator in a molar proportion of 0.001 to 10 mol %, such as 0.001 to 2 mol %.

Especially preferred are phosphors selected from the group of phosphors with general formula of general formula $Sr_{1-y-z}Ln_ySi_2AlO_{2-y}N_{3+y}:Eu_z$, wherein $0 \leq y \leq 1$ and $0.001 < z \leq 0.1$.

The Europium(II)-Activated Alkaline Earth Oxonitridoalumosilicate Phosphor

Figure 1:
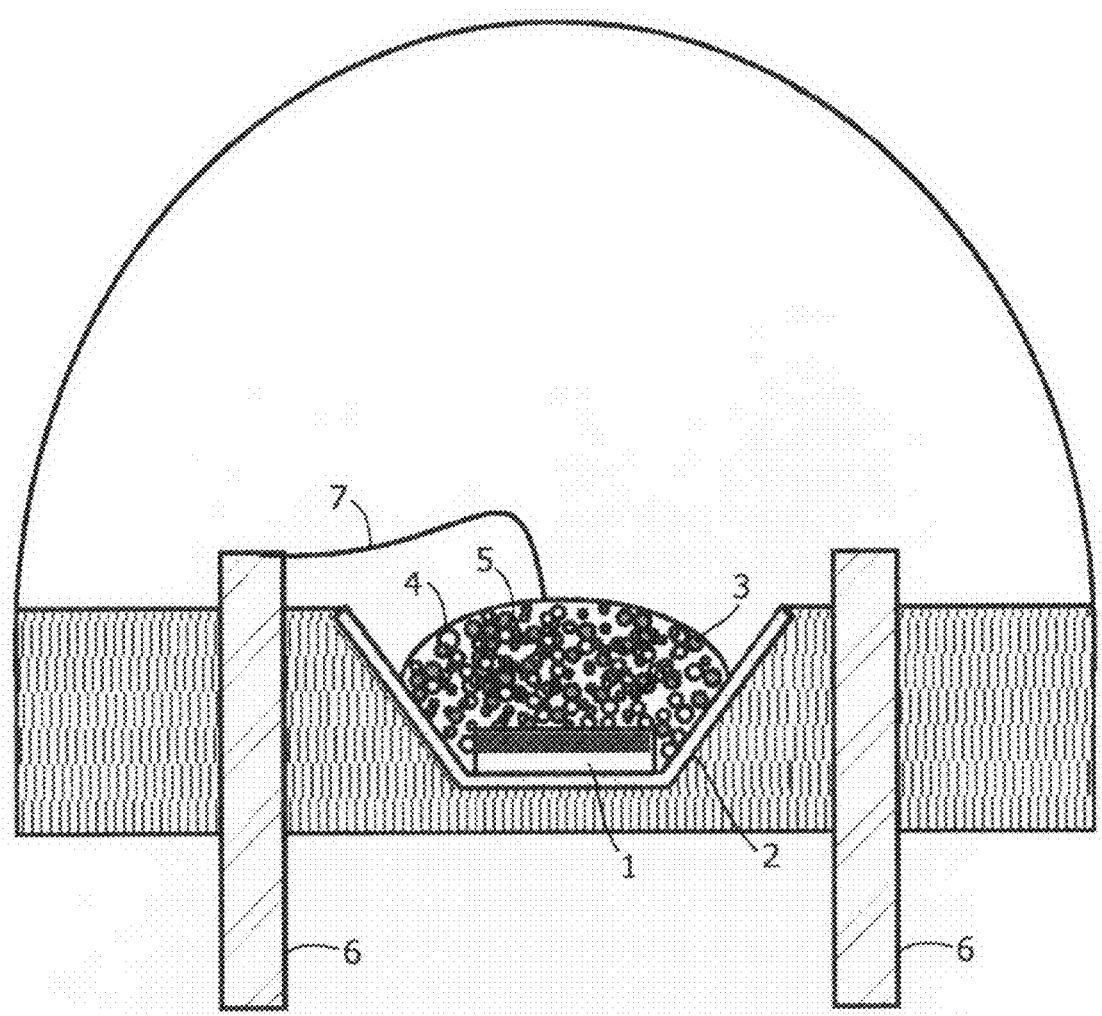
FIG. 1 shows a schematic view of a dichromatic white LED lamp comprising a phosphor of the present invention positioned in a pathway of light emitted by a LED structure.

The phosphor of general formula $AE_{1-y-z}Ln_ySi_{3-x}Al_{x-a}M_aO_{1+x-y}N_{4-x+y}:Eu_z$, wherein AE is selected from the group of Sr, Ca, Ba, Mg and Zn; Ln is selected from the group of La, Ce, Pr, Nd, Sm, Gd, Tb, Dy, Ho, Er, Tm, Yb, Lu, and Y; M is a trivalent metal selected from the group of boron, gallium and scandium and $0 \leq a < 2$, $0 \leq x < 2$, $0 \leq y \leq 1$, $0.001 < z \leq 0.1$ comprises a host lattice with the main components of silicon, aluminum, nitrogen and oxygen, derived from the basic $LaSi_3N_5$ structure.

In the basic $LaSi_3N_5$ structure type, three nitrogen atoms connect two silicon atoms and two nitrogen atoms connect three silicon atoms to form an anionic framework $[Si^{[4]}_3N^{[2]}_3N^{[3]}_2]^{2-}$. The essential feature of this invention is that the bridging $N^{[2]}$ atoms are substituted by O atoms and, in order to maintain charge neutrality, either an equimolar amount of Si atoms is substituted by trivalent atoms like Al, B or Ga or an equimolar amount of Ln atoms is substituted by divalent atoms of alkaline earth or transition metals like Sr, Ba, Mg and Zn, Mg and Zn, Ca, Zn and Mg. Examples of compounds according to this invention are $SrSi_2AlO_2N_3$, $LaSrSi_6N_9O$, or $CaSrSi_3Al_3O_5N_5$.

The preferred alkaline earth metal is strontium, yet strontium can also be partly substituted by calcium and/or barium in an amount up to 50 mol % and can be fully substituted by magnesium. While incorporation of calcium leads to a slight red shift of the emission, the incorporation of barium leads to a blue shift of the emission. Part of the strontium cations may also be substituted by zinc. Part or all of aluminum can be substituted by boron, gallium and scandium.

Additional doping is possible with praseodymium(III) and samarium(III) to enhance the red emission.

The amount of a co-activator can vary, depending on the amount of red color that may be required in the white output light for a particular application.

Especially preferred are phosphors selected from the group of phosphors with general formula of general formula $Sr_{1-y-z}Ln_ySi_2AlO_{2-y}N_{3+y}:Eu_z$, wherein $0 \leq y \leq 1$ and $0.001 < z \leq 0.1$. The proportion z of europium(II) is preferably in a range of $0.001 < z < 0.1$. When the proportion z of europium(II) is 0.001 or lower, luminance decreases because the number of excited emission centers of photoluminescence due to europium(II)-cations decreases and, when the z is greater than 0.1, density quenching occurs. Density quenching refers to the decrease in emission intensity, which occurs when the concentration of an activation agent added to increase the luminance of the luminescent material is increased beyond an optimum level.

Phosphors of general formula $AE_{1-y-z}Ln_ySi_{3-x}Al_{x-a}B_aO_{1+x-y}N_{4-x+y}:Eu_z$ show the following spectroscopic trends: (a) absolute position and width of excitation and emission bands are shifted to lower energy by an increasing N content caused by an increased nephelauxetic effect of N ligands compared to O ligands and thus an energy lowering of the Eu(II) 5d states, (b) absolute position and width of excitation and emission bands are shifted to lower energy by incorporation of a smaller host lattice cation, caused by an increased ligand field splitting of the Eu(II) 5d states due to shortened activator-ligand contacts, and (c) absolute position and width of emission bands are shifted to lower energy by increasing the Eu(II) concentration caused by increased reabsorption of emitted light because of the spectral overlap of excitation and emission bands.

Figure 3:
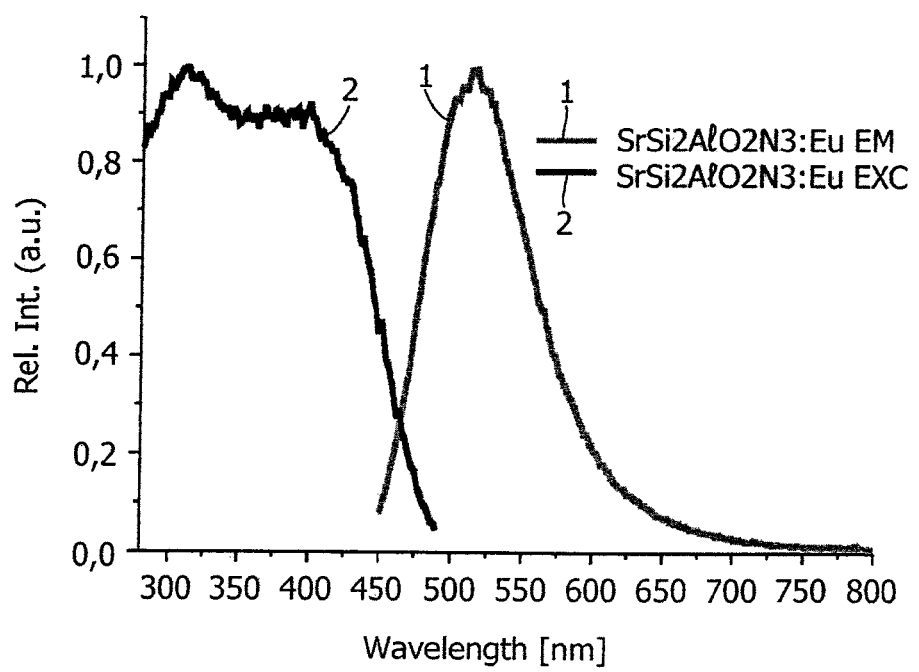
FIG. 3 shows the excitation (EXC) and emission (EM) spectra of $SrSi_2AlO_2N_3:Eu(2\%)$.

FIG. 3 shows the excitation (EXC) and emission (EM) spectra of $SrSi_2AlO_2N_3:Eu(2\%)$. Compared to the known material $SrSiAl_2O_3N_2:Eu$ the excitation as well as the emission band are shifted towards longer wavelengths and therefore the novel phosphor is excitable by blue LED light of a longer wavelength ranges.

The method for producing a europium(II)-activated alkaline earth oxonitridoalumosilicate phosphor of the present invention is not particularly restricted, and it can be produced by any method, which will provide phosphors according to the invention. A series of compositions of general formula $AE_{1-y-z}Ln_ySi_{3-x}(Al,B,Ga)_xO_{1+x-y}Na_{4-x+y}:Eu_z$ can be manufactured, which form a complete solid solution.

A preferred process for producing a phosphor according to the invention is referred to as the solid-state method. In this process, the phosphor precursor materials are mixed in the solid state and are heated so that the precursors react and form a powder of the phosphor material.

In a specific embodiment these green to yellow emitting phosphors are prepared as phosphor powders by the following technique: Alkaline earth carbonates are mixed with silicon nitride $Si_3N_4$, aluminum nitride and europium(III) fluoride as a dopant and a flux in predetermined ratios. The mixture is placed into a high purity alumina crucible. The crucibles are loaded into a crucible and then into a tube furnace and purged with flowing nitrogen/hydrogen for several hours. The furnace parameters are 10° C./min to 1500° C., followed by a 4 hour dwell at 1450° C. after which the furnace is slowly cooled to room temperature.

The samples are finely ground before a second annealing step at 1600° C. is performed.

Luminous output may be improved through an additional third anneal at slightly lower temperatures in flowing argon.

In another method, phosphor powder particle precursors or phosphor particles are dispersed in slurry, which is then spray-dried to evaporate the liquid. Therefore, the particles are sintered in the solid state at an elevated temperature to crystallize the powder and form a phosphor. The spray-dried powder is then converted to an oxonitridoalumosilicate phosphor by sintering at an elevated temperature to crystallize the powder and to form the phosphor. The fired powder is then lightly crushed and milled to recover phosphor particles of desired particle size. The resulting luminescent material is then ground again, washed with water and ethanol, dried and sieved.

Figure 2:
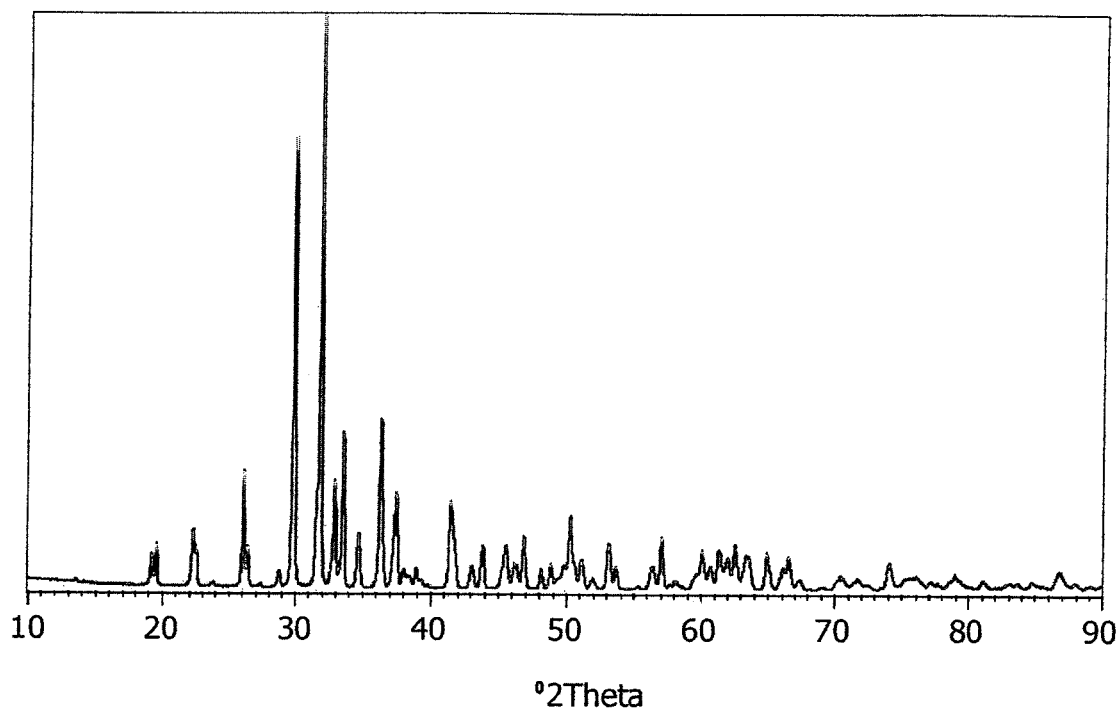
FIG. 2 shows the XRD pattern of $SrSi_2AlO_2N_3:Eu(2\%)$.

After firing, the powders are characterized by powder X-ray diffraction (Cu, Kα-line), which shows that the desired crystal structure has formed. FIG. 2 shows the XRD pattern of $SrSi_2AlO_2N_3$:Eu(2 %). Table 1 shows that compared to undoped $SrSiAl_2O_3N_2$ the lattice constants of the crystallographic orthorhombic unit cell are slightly changed.

TABLE 1

| lattice constants of $SrSi_2AlO_2N_3$:Eu(2%) and $SrSiAl_2O_3N_2$ | | | |
| --- | --- | --- | --- |
| compound | a [Å] | b [Å] | c [Å] |
| $SrSi_2AlO_2N_3$:Eu(2%) | 4.944(2) | 7.953(3) | 11.339(4) |
| $SrSiAl_2O_3N_2$ | 4.9198 | 7.8973 | 11.3494 |

Europium (ID-activated alkaline earth oxonitridoalumosilicate type phosphors are resistant to heat, light and moisture, because of their alkaline earth oxonitridoalumosilicate host lattice. Resistance to thermally enhanced photodegradation is of importance as light-emitting diodes in operation can become very hot and any material surrounding the LED will also heat up. The heat can damage a conventional phosphor surrounding the LED, degrading its ability to down-convert the LED's light. The phosphors according to the invention are heat resistant and suited for applications up to 500° C.

Preferably the europium(II)-activated type phosphors according to the invention may be coated with a thin, uniform protective layer of one or more compounds selected from the group formed by the fluorides and orthophosphates of the elements aluminum, scandium, yttrium, lanthanum gadolinium and lutetium, the oxides of aluminum, yttrium and lanthanum and the nitride of aluminum.

The protective layer thickness customarily ranges from 0.001 to 0.2 micrometers and, thus, is so thin that it can be penetrated by the radiation of the radiation source without substantial loss of energy. The coatings of these materials on the phosphor particles can be applied, for example, by deposition from the gaseous phase in a wet-coating process.

To improve their absorption characteristics, these phosphors are preferably used in a grain size distribution in a range of medium grain size $d_{m1}$>500 nm.

The Illumination System

The invention also relates to an illumination system comprising a radiation source and a luminescent material comprising a europium(II)-activated earth alkaline oxonitridoalumosilicate of general formula $AE_{1-y-z}Ln_ySi_{3-x}Al_{x-a}M_a O_{1+x-y}N_{4-x+y}$:$Eu_z$, wherein AE is selected from the group of Sr, Ca, Ba, Mg and Zn; Ln is selected from the group of La, Ce, Pr, Nd, Sm, Gd, Tb, Dy, Ho, Er, Tm, Yb, Lu, and Y; M is a trivalent metal selected from the group of boron, gallium and scandium and $0 \leq a < 2$, $0 \leq x < 2$, $0 \leq y \leq 1$, $0.001 < z \leq 0.1$.

Radiation sources include semiconductor optical radiation emitters and other devices that emit optical radiation in response to electrical excitation. Semiconductor optical radiation emitters include light emitting diode LED chips, light emitting polymers (LEPs), organic light emitting devices (OLEDs), polymer light emitting devices (PLEDs), etc.

Moreover, light emitting components such as those found in discharge lamps and luminescent lamps, such as mercury low and high pressure discharge lamps, sulfur discharge lamps, and discharge lamps based an molecular radiators are also contemplated for use as radiation sources with the present inventive phosphor compositions.

In a preferred embodiment of the invention the radiation source is a light-emitting diode (LED). It is one of the advantages of the invention that it provides different colors and hues of light sources by using various ratios and types of phosphor blends in an assembly with one or more light emitting diodes.

Any configuration of an illumination system which includes a light emitting diode and a europium(II) activated alkaline earth oxonitridoalumosilicate phosphor composition is contemplated in the present invention, preferably with addition of other well-known phosphors, which can be combined to achieve a specific color or white light when irradiated by a LED emitting primary UVA, violet or blue light as specified above. A detailed construction of one embodiment of such illumination system comprising a radiation source and a luminescent material shown in FIG. 1 will now be described.

FIG. 1 shows a schematic view of a chip type light emitting diode with a coating comprising the luminescent material. The device comprises chip type light emitting diode 1 as a radiation source. The light emitting diode chip is positioned in a reflector cup lead frame 2. The die 1 is connected via a bond wire 7 to a first terminal 6, and directly to a second electric terminal 6. The recess of the reflector cup is filled with a coating material that contains a luminescent material according to the invention to form a coating layer that is embedded in the reflector cup. The phosphors are applied either separately or in a mixture. The coating material typically comprises a polymer 5 for encapsulating the phosphor 3 or phosphor blend 3,4. In this embodiment, the phosphor or phosphor blend should exhibit high stability properties against the encapsulant. Preferably, the polymer is optically clear to prevent significant light scattering. A variety of polymers are known in the LED industry for making LED illumination systems.

In one embodiment, the polymer is selected from the group consisting of epoxy and silicone resins. Adding the phosphor mixture to a liquid that is a polymer precursor can provide encapsulation. For example, the phosphor mixture can be a granular powder. Introducing phosphor particles into polymer precursor liquid results in formation of a slurry (i.e. a suspension of particles). Upon polymerization, the phosphor mixture is fixed rigidly in place by the encapsulation. In one embodiment, both the luminescent material and the LED die are encapsulated in the polymer.

The transparent coating material may comprise light-diffusing particles, advantageously so-called diffusers. Examples of such diffusers are mineral fillers, in particular $ZrO_2$, $CaF_2$, $TiO_2$, $SiO_2$, $CaCO_3$ or $BaSO_4$ or any other organic pigments. These materials can be added in a simple manner to the above-mentioned resins.

In operation, electrical power is supplied to activate the die. When activated, the die emits the primary light, e.g. blue light. A portion of the emitted primary light is completely or partially absorbed by the luminescent material in the coating layer. The luminescent material then emits secondary light, i.e., the converted light having a longer peak wavelength, primarily yellow green in a sufficiently broadband range in response to absorption of the primary light. The remaining unabsorbed portion of the emitted primary light is transmitted through the luminescent layer, along with the secondary light. The encapsulation directs the unabsorbed primary light and the secondary light in a general direction as output light. Thus, the output light is a composite light that is composed of the primary light emitted from the die and the secondary light emitted from the luminescent layer.

The color temperature or color point of the output light of an illumination system according to the invention will vary depending upon the spectral distributions and intensities of the secondary light in comparison to the primary light.

Firstly, the color temperature or color point of the primary light can be varied by a suitable choice of the light emitting diode. Secondly, the color temperature or color point of the secondary light can be varied by a suitable choice of the phosphor in the luminescent material, its particle size and its concentration. Furthermore, these arrangements also advantageously afford the possibility of using phosphor blends in the luminescent material, as a result of which, advantageously, the desired hue can be set even more accurately.

The White Light Phosphor Converted Light Emitting Device

According to one aspect of the invention the output light of the illumination system may have a spectral distribution such that it appears to be "white" light.

In a first embodiment, a white light emitting illumination system according to the invention can advantageously be produced by choosing the luminescent material such that a blue radiation emitted by a blue light emitting diode is converted to complementary wavelength ranges, to form dichromatic (BY) white light. In this case, yellow green light is produced by means of the luminescent materials that comprise a europium(II)-activated alkaline earth oxonitridoalumosilicate phosphor. Also a second luminescent material can be used, in addition, in order to improve the color rendering of this illumination system.

Particularly good results are achieved with a blue LED whose emission maximum lies at 400 to 480 nm. An optimum has been found to lie at 445 to 468 nm more especially 450 nm, taking particular account of the excitation spectrum of the europium(II)-activated alkaline earth oxonitridoalumosilicate.

The color output of the LED-phosphor system is very sensitive to the thickness of the phosphor layer or the amount of phosphor in the phosphor layer respectively. If the phosphor layer is thick and comprises an excess amount of a yellow green europium(II) activated alkaline earth oxonitridoalumosilicate phosphor, then a lesser amount of the blue LED light will penetrate through the thick phosphor layer. The combined LED-phosphor system will then in operation appear yellowish white, because the yellow green secondary light of the phosphor dominates it. Therefore, the thickness of the phosphor layer is a variable affecting the color output of the system. A large range of flexibility is available both for providing the desired chromaticity and controlling the color output of the individual devices.

In one specific embodiment a white-light emitting illumination system according to the invention can particularly preferably be realized by admixing the inorganic luminescent material $SrSi_2AlO_2N_3$:Eu(2 %) in various concentrations with a silicon resin used to produce the luminescence conversion encapsulation or layer for a 450 nm InGaN light emitting diode.

Part of a blue radiation emitted by a 450 nm InGaN light emitting diode is shifted by the inorganic luminescent material $SrSi_2AlO_2N_3$:Eu(2 %) to the yellow, amber or red spectral region and, consequently, to a wavelength range which is complementarily colored with respect to the color blue. A human observer perceives the combination of blue primary light and the secondary light of the yellow green-emitting phosphor as white light.

In another embodiment, a white-light emitting illumination system according to the invention can advantageously be produced by choosing the luminescent material such that a blue radiation emitted by the blue light emitting diode is converted into complementary wavelength ranges, to form polychromatic especially trichromatic (RGB) white light. In this case, green light is produced by means of the luminescent materials that comprise a blend of phosphors including europium(II)-activated alkaline earth oxonitridoalumosilicate phosphor and a second phosphor.

Yielding white light emission with high color rendering is possible by using the yellow green broad band emitter phosphors together with a red narrow band emitting phosphor to cover the whole spectral range together with a blue-light emitting LED.

The red light emitting phosphor may be especially selected from the group of $(Ca_{1-x}Sr_x)S$:Eu, wherein $0 \leq x \leq 1$ and $(Sr_{1-x-y}Ba_xCa_y)_{2-z}Si_{5-a}Al_aN_{8-a}O_a$:$Eu_z$ wherein $0 \leq a < 5$, $0 < x \leq 1$, $0 \leq y \leq 1$ and $0 < z \leq 0.2$.

Optical properties of useful second phosphors are summarized in the following Table 2.

TABLE 2

| Composition | $\lambda_{max}$ [nm] | Color point x, y |
|---|---|---|
| $(Sr_{1-x-y}Ca_xBa_y)_2Si_{5-a}Al_aN_{8-a}O_a$:Eu | 615-650 | * |
| CaS:Eu | 655 | 0.700, 0.303 |
| $(Sr_{1-x}Ca_x)S$:Eu | 610-655 | * |

The hue (color point in the CIE chromaticity diagram) of the white light thereby produced can in this case be varied by a suitable choice of the phosphors in respect of mixture and concentration.

In another embodiment, a white-light emitting illumination system according to the invention can advantageously be produced by choosing the luminescent material such that a UVA radiation emitted by the UVA light emitting diode is converted into complementary wavelength ranges, to form dichromatic white light. In this case, the yellow and blue light is produced by means of the luminescent materials. Yellow green light is produced by means of the luminescent materials that comprise a europium(II)-activated alkaline earth oxonitridoalumosilicate phosphor. Blue light is produced by means of the luminescent materials that comprise a blue phosphor selected from the group comprising $BaMgAl_{10}O_{17}$:Eu, $Ba_5SiO_4(Cl,Br)_6$:Eu, $CaLn_2S_4$:Ce and $(Sr,Ba,Ca)_5(PO_4)_3Cl$:Eu.

Particularly good results are achieved in conjunction with a UVA light emitting diode, whose emission maximum lies at 300 to 400 nm. An optimum has been found to lie at 365 nm, taking particular account of the excitation spectrum of the europium(II)-activated alkaline earth oxonitridoalumosilicate.

In a further embodiment, a white-light emitting illumination system according to the invention can advantageously be produced by choosing the luminescent material such that UVA radiation emitted by a UVA emitting diode is converted into complementary wavelength ranges, to form polychromatic white light e.g. by additive color triads, for example blue, green and red.

In this case, the yellow to red, the green and blue light is produced by means of the luminescent materials.

The luminescent materials may be a blend of a green europium(II) activated alkaline earth oxonitridoalumosilicate phosphor, a blue phosphor selected from the group comprising $BaMgAl_{10}O_{17}$:Eu, $Ba_5SiO_4(Cl,Br)_6$:Eu, $CaLn_2S_4$:Ce and $(Sr,Ba,Ca)_5(PO_4)_3Cl$:Eu and a red phosphor selected from the group comprising $(Ca_{1-x}Sr_x)S$:Eu, wherein $0 \leq x \leq 1$ and $(Sr_{1-x-y}Ba_xCa_y)_{2-z}Si_{5-a}Al_aN_{8-a}O_a$:Eu$_z$ wherein $0 \leq a<5$, $0<x \leq 1$, $0 \leq y \leq 1$ and $0<z \leq 0.2$.

Also a second red luminescent material can be used, in addition, in order to improve the color rendition of this illumination system.

The hue (color point in the CIE chromaticity diagram) of the white light thereby produced can in this case be varied by a suitable choice of the phosphors in respect of mixture and concentration.

The Yellow to Green Phosphor Converted Emitting Device Light

According to further aspect of the invention an illumination system that emits output light having a spectral distribution such that it appears to be "yellow to green" light is provided.

A luminescent material comprising europium(II)-activated alkaline earth oxonitridoalumosilicate as phosphor is particularly well-suited as a yellow to green component for stimulation by a primary UVA or blue radiation source such as, for example, a UVA-emitting LED or blue-light emitting LED. It is possible thereby to implement an illumination system emitting in the yellow to green regions of the electromagnetic spectrum.

The invention claimed is:

1. An illumination system, comprising a radiation source and a luminescent material comprising a phosphor capable of absorbing a part of light emitted by the radiation source and emitting light of a wavelength different from that of the absorbed light; wherein said phosphor is a europium-activated oxonitridoalumosilicate of general formula $AE_{1-y-z}Ln_ySi_{3-x}Al_{x-a}M_aO_{1+x-y}N_{4-x+y}$:Eu$_z$, wherein AE is selected from the group of Sr, Ca, Ba, Mg and Zn; Ln is selected from the group of La, Ce, Pr, Nd, Sm, Gd, Tb, Dy, Ho, Er, Tm, Yb, Lu, and Y; M is a trivalent metal selected from the group of boron, gallium and scandium and $0 \leq a<2$, $0 \leq x<2$, $0 \leq y \leq 1$, $0.001<z \leq 0.1$.

2. The illumination system according to claim 1, wherein the radiation source is a light emitting diode.

3. The illumination system according to claim 1, wherein the radiation source is selected from the light emitting diodes having an emission with a peak emission wavelength in the range of 400 to 480 nm.

4. The illumination system according to claim 1, wherein the luminescent material comprises a second phosphor.

5. The illumination system according to claim 4, wherein the second phosphor is a red phosphor selected from the group of $(Ca_{1-x}Sr_x)S$:Eu, wherein $0 \leq x \leq 1$, and $(Sr_{1-x-y}Ba_xCa_y)_{2-z}Si_{5-a}Al_aN_{8-a}O_a$:Eu$_z$ wherein $0 \leq a<5$, $0<x \leq 1$, $0 \leq y \leq 1$ and $0<z \leq 0.09$.

6. A luminescent material comprising a phosphor capable of absorbing a part of light emitted by the radiation source and emitting light of a wavelength different from that of the absorbed light; wherein said phosphor is a europium-activated oxonitridoalumosilicate of general formula $AE_{1-y-z}Ln_ySi_{3-x}Al_{x-a}M_aO_{1+x-y}N_{4-x+y}$:Eu$_z$ wherein AE is selected from the group of Sr, Ca, Ba, Mg and Zn; Ln is selected from the group of La, Ce, Pr, Nd, Sm, Gd, Tb, Dy, Ho, Er, Tm, Yb, Lu, and Y; M is a trivalent metal selected from the group of boron, gallium and scandium and $0 \leq a<2$, $0 \leq x<2$, $0 \leq y \leq 1$, $0.001<z \leq 0.1$.

7. The luminescent material according to claim 6, wherein the phosphor of general formula $AE_{1-y-z}Ln_ySi_{3-x}Al_{x-a}M_aO_{1+x-y}N_{4-x+y}$:Eu$_z$ comprises praseodymium(III) and samarium(III) as co-activators.

8. The luminescent material according to claim 7, wherein the phosphor comprises the co-activator in a molar proportion of 0.001 to 10 mol %.

9. The luminescent material according to claim 7, wherein said phosphor is a europium(II)-activated alkaline earth oxonitridoalumosilicate of general formula $Sr_{1-y-z}Ln_ySi_2AlO_{2-y}N_{3+y}$:Eu$_z$, wherein $0 \leq y \leq 1$ and $0.001<z \leq 0.1$.

* * * * *